(12) United States Patent
Kruijt-Stegeman et al.

(10) Patent No.: US 8,579,625 B2
(45) Date of Patent: Nov. 12, 2013

(54) IMPRINT LITHOGRAPHY

(75) Inventors: Yvonne Wendela Kruijt-Stegeman, Eindhoven (NL); Raymond Jacobus Wilhelmus Knaapen, Helmond (NL); Johan Frederik Dijksman, Weert (NL); Sander Frederik Wuister, Eindhoven (NL); Ivar Schram, Weert (NL); Raymond Wilhelmus Louis LaFarre, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 135 days.

(21) Appl. No.: 12/285,698

(22) Filed: Oct. 10, 2008

(65) Prior Publication Data
US 2009/0108484 A1 Apr. 30, 2009

Related U.S. Application Data (60) Provisional application No. 60/960,727, filed on Oct. 11, 2007.

(51) Int. Cl.
*B28B 17/00* (2006.01)
*B29C 59/00* (2006.01)

(52) U.S. Cl.
USPC ............ 425/385; 425/149; 425/150; 264/293

(58) Field of Classification Search
USPC ............................ 425/385, 149, 150; 264/293
See application file for complete search history.

(56) References Cited

U.S. PATENT DOCUMENTS

| | | | |
|---|---|---|---|
| 4,731,155 A | | 3/1988 | Napoli et al. |
| 4,738,146 A | * | 4/1988 | Baumgartner et al. ..... 73/862.68 |
| 5,365,140 A | * | 11/1994 | Ohya et al. ..................... 310/328 |
| 5,567,199 A | * | 10/1996 | Huber et al. .................. 451/398 |
| 5,772,905 A | | 6/1998 | Chou |
| 5,854,819 A | * | 12/1998 | Hara et al. ....................... 378/34 |
| 6,180,239 B1 | | 1/2001 | Whitesides et al. |
| 6,334,960 B1 | | 1/2002 | Willson et al. |
| 6,696,220 B2 | | 2/2004 | Bailey et al. |

(Continued)

FOREIGN PATENT DOCUMENTS

| | | |
|---|---|---|
| JP | 2004-523906 T | 8/2004 |
| JP | 2005-005284 | 1/2005 |

(Continued)

OTHER PUBLICATIONS

J. Haisma et al., "Mold-assisted nanolithography: A process for reliable pattern replication", J. Vac. Sci. Technol. B 14(6), Nov./Dec. 1996, pp. 4124-4128.

(Continued)

*Primary Examiner* — Richard Crispino
*Assistant Examiner* — Robert Dye
(74) *Attorney, Agent, or Firm* — Pillsbury Winthrop Shaw Pittman LLP (57) ABSTRACT

An imprint lithography apparatus is disclosed that includes a support structure configured to hold an imprint template. The apparatus further includes an actuator located between the support structure and a side of the imprint template, when the imprint template is held by the support structure, configured to apply a force to the imprint template and a force sensor between the support structure and a side of the imprint template, when the imprint template is held by the support structure.

29 Claims, 10 Drawing Sheets

(56) References Cited

U.S. PATENT DOCUMENTS

| | | | |
|---|---|---|---|
| 6,715,336 B1 * | 4/2004 | Xu | 73/7 |
| 6,791,664 B2 * | 9/2004 | Auer et al. | 355/72 |
| 6,847,433 B2 * | 1/2005 | White et al. | 355/72 |
| 7,198,276 B2 * | 4/2007 | Caldwell et al. | 279/128 |
| 7,202,935 B2 | 4/2007 | Lee et al. | |
| 7,296,519 B2 | 11/2007 | Dona et al. | |
| 7,420,654 B2 | 9/2008 | Cherala et al. | |
| 7,459,701 B2 | 12/2008 | Baggen et al. | |
| 7,535,549 B2 * | 5/2009 | Cherala et al. | 355/52 |
| 7,649,613 B2 | 1/2010 | Butler | |
| 2002/0115002 A1 | 8/2002 | Bailey et al. | |
| 2004/0124566 A1 | 7/2004 | Sreenivasan et al. | |
| 2004/0146792 A1 | 7/2004 | Nimmakayala et al. | |
| 2005/0006343 A1 * | 1/2005 | Choi et al. | 216/59 |
| 2005/0173049 A1 | 8/2005 | Dona et al. | |
| 2005/0178280 A1 | 8/2005 | Lee et al. | |
| 2005/0189767 A1 | 9/2005 | Lancien | |
| 2005/0269745 A1 | 12/2005 | Cherala et al. | |
| 2005/0274693 A1 | 12/2005 | Heidari et al. | |
| 2006/0279022 A1 * | 12/2006 | Seki et al. | 264/320 |
| 2007/0035717 A1 * | 2/2007 | Wu et al. | 355/78 |
| 2007/0126150 A1 | 6/2007 | GanapathiSubramanian et al. | |
| 2007/0206169 A1 * | 9/2007 | Butler | 355/53 |
| 2008/0145774 A1 | 6/2008 | Kruijt-Stegeman et al. | |

FOREIGN PATENT DOCUMENTS

| | | |
|---|---|---|
| JP | 2005-297109 | 10/2005 |
| JP | 2006-116602 | 5/2006 |
| JP | 2007-258695 | 10/2007 |
| WO | WO 02/067055 A2 | 8/2002 |

OTHER PUBLICATIONS

Japanese Office Action mailed May 10, 2011 in corresponding Japanese Patent Application No. 2008-262679.

Japanese Office Action mailed Dec. 12, 2011 in corresponding Japanese Patent Application No. 2008-262679.

* cited by examiner

IMPRINT LITHOGRAPHY

CROSS-REFERENCE TO RELATED APPLICATIONS

This application claims the benefit of priority from U.S. provisional patent application Ser. No. 60/960,727, filed on Oct. 11, 2007, the entire content of which is incorporated herein by reference.

FIELD

The present invention relates to imprint lithography.

BACKGROUND

In lithography, there is an ongoing desire to reduce the size of features in a lithographic pattern to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a template to transfer a pattern onto a substrate. An advantage of imprint lithography is that the resolution of the features is not limited by, e.g., the wavelength of a radiation source or the numerical aperture of a projection system as in photolithography, but mainly just by the pattern density on the template (also referred to as a stamp). There are three main approaches to imprint lithography, examples of which are schematically depicted in FIGS. 1a to 1c.

Figure 1A:
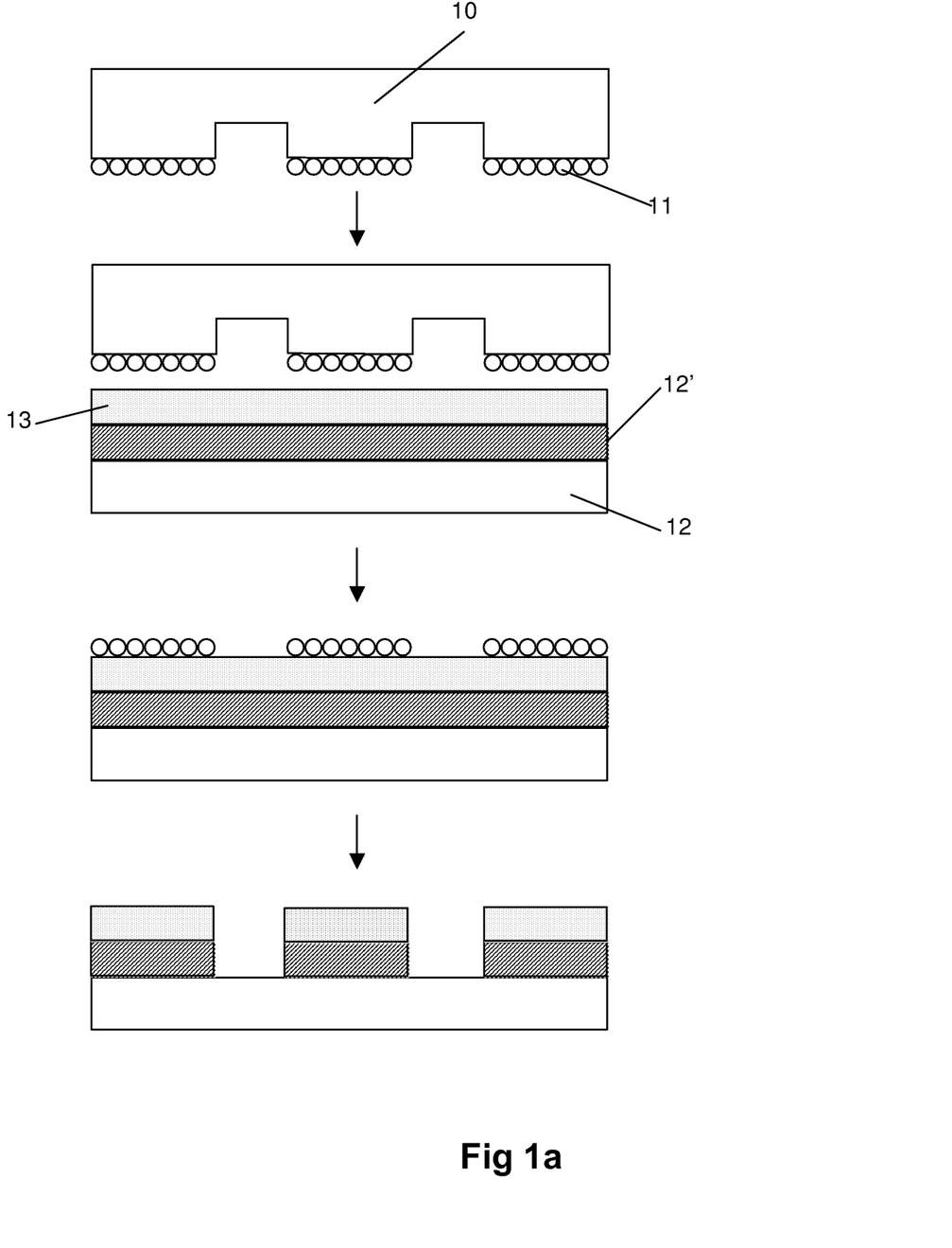
FIGS. 1a-c schematically show examples of, respectively, micro-contact printing, hot imprint, and UV imprint.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto a resist layer 13 which is supported by a substrate 12 and planarization and transfer layer 12'. The template 10 has a pattern of features on its surface, the molecular layer being disposed upon the features. When the template comes into contact with the resist layer, the layer of molecules 11 are transferred onto the resist. After the template disengages from contact with the resist layer, the resist is etched such that the areas of the resist not covered by the transferred molecular layer are etched down to the substrate. For more information on micro-contact printing, see e.g. U.S. Pat. No. 6,180,239.

Figure 1B:
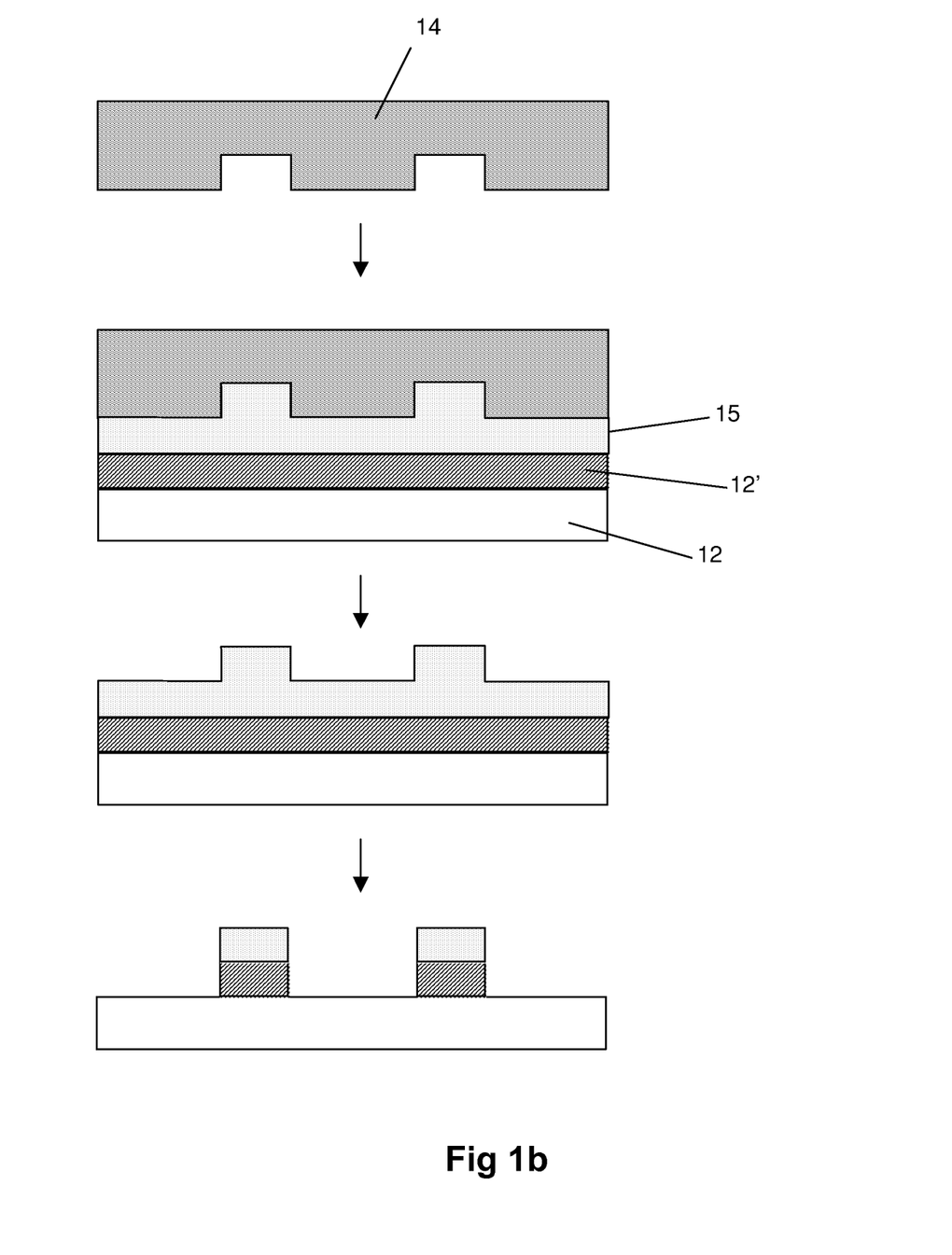

FIG. 1b shows an example of so-called hot imprint lithography (or hot embossing). In a typical hot imprint process, a template 14 is imprinted into a thermosetting or a thermoplastic polymer resin 15 (more generally an imprintable medium), which has been cast on the surface of a substrate 12. The resin may, for instance, be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then disengage and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template engages the flowable resin, which cooled to below its glass transition temperature with the template in place to harden the pattern. Thereafter, the template disengages. The pattern will consist of the features in relief from a residual layer of the resin, which residual layer may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

Figure 1C:
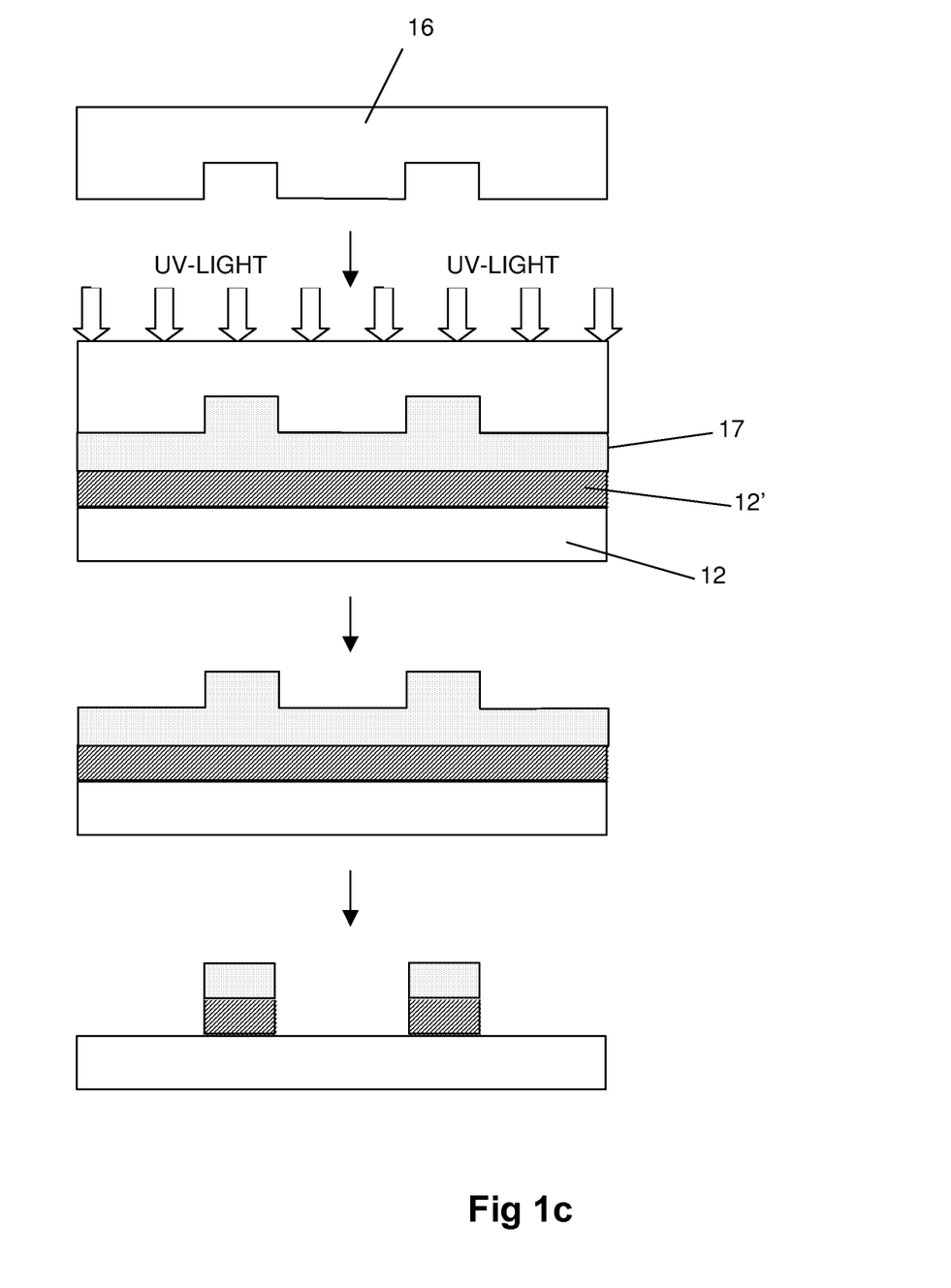

FIG. 1c shows an example of ultraviolet (UV) imprint lithography, which involves the use of a transparent template and a UV-curable liquid as an imprintable medium (the term "UV" is used here for convenience but should be interpreted as including any suitable actinic radiation for curing the resist). An UV curable liquid is often less viscous than a thermosetting and thermoplastic resin used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the resin with UV radiation that is applied through the quartz template onto the resin. After the template disengages, the pattern will consist of the features in relief from a residual layer of the resin, which residual layer may then be removed by an appropriate etch process to leave only the pattern features. A particular manner of patterning a substrate through UV imprint lithography is so-called step and flash imprint lithography (SFIL), which may be used to pattern a substrate in a number of subsequent steps in a similar manner to optical steppers conventionally used in IC manufacture. For more information on UV imprint, see e.g. United States published patent application 2004-0124566, U.S. Pat. No. 6,334,960, PCT patent application publication no. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., United States patent application publication no. 2005-0274693, which mentions a combination of heating and UV curing a resist.

SUMMARY

There are possible applications of imprint lithography in which it is desirable to apply a force to the imprint template, in order to deform the template to a desired extent. Examples of such applications include magnification correction (typically demagnification), shape correction, and an imprint technique utilizing a curved flexible imprint template.

Although magnification correction and shape correction may be of benefit in overcoming the effect of temperature, wear and/or manufacturing defects on imprint template function, a difficulty may arise in ensuring that a desired amount of force is applied to an imprint template, and thus that a desired amount of deformation is attained. A difficulty in applying a desired amount of force may occur as a result of uncertainty regarding the force applied by an actuator to a peripheral edge of the imprint template. Such uncertainty may arise as a result of misalignment or introduction of a gap during manufacture or fitting of an imprint template, and/or due to distortion of a supporting structure against which the actuator abuts.

Figure 3A:
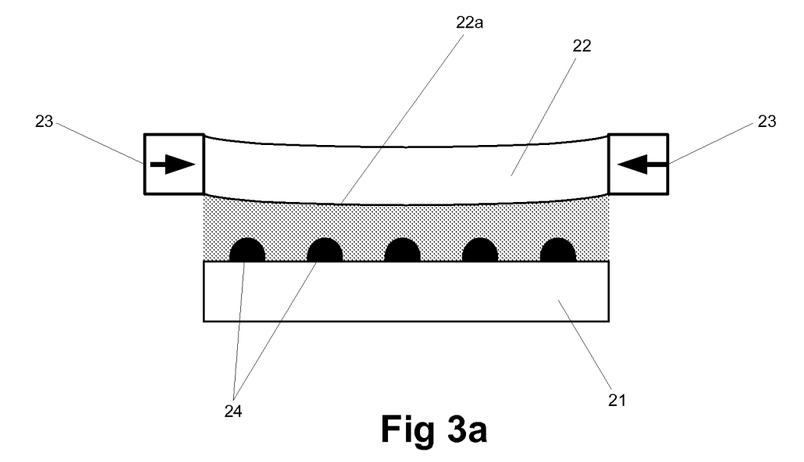
FIGS. 3a and 3b schematically show the flow of liquid and gas during an imprint process utilizing a bent imprint template.
Figure 3B:
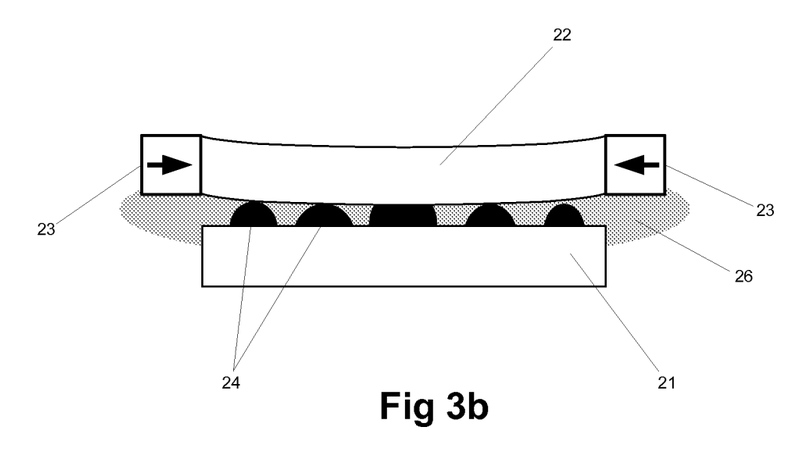

Similarly, although the use of a bent template (as outlined above with reference to FIG. 3) provides an advantage over a conventional imprint lithography technique it may, in certain circumstances, be difficult to ensure that a desired amount of force is applied to an imprint template, and thus that a desired degree of curvature is attained. A difficulty in applying a desired amount of force may arise as a result of uncertainty regarding the force applied by the actuator to a peripheral edge of the imprint template. Such uncertainty may arise as a result of misalignment or introduction of a gap during manufacture or fitting of an imprint template, and/or due to distortion of a supporting structure against which the actuator abuts.

It is desirable to provide, for example, an imprint lithography apparatus and method which overcomes or mitigates at least one problem associated with the art, whether identified herein or elsewhere.

According to an aspect of the present invention, there is provided an imprint lithography apparatus comprising a support structure configured to hold an imprint template; an actuator located between the support structure and a side of the imprint template, when the imprint template is held by the support structure, configured to apply a force to the imprint template; and a force sensor between the support structure and a side of the imprint template, when the imprint template is held by the support structure.

According to an aspect of the present invention, there is provided an imprint lithography apparatus, comprising: an imprint template supported by a support structure; an actuator, located between the support structure and a side of the imprint template, configured to apply a force to the imprint template; and a force sensor located between the support structure and a side of the imprint template.

According to an aspect of the present invention, there is provided an imprint lithography method, comprising: applying a force to a side of an imprint template; assessing the force applied to the imprint template by means of a force sensor; and determining whether the force applied to the imprint template is sufficient to achieve a desired deformation of the imprint template.

According to an aspect of the present invention, there is provided an imprint lithography method comprising: applying a force to a side of an imprint template; assessing the force applied to the imprint template by means of a force sensor; and determining whether the force applied to the imprint template is sufficient to achieve a desired curvature of the imprint template.

According to an aspect of the present invention, there is provided an imprint lithography apparatus comprising an imprint template supported by a support structure, an actuator located between the support structure and a side of the imprint template configured to apply a force to the imprint template, wherein the actuator is arranged to apply a force to a side of the imprint template at a position substantially on the neutral plane of the imprint template.

According to an aspect of the present invention, there is provided an imprint lithography apparatus comprising a support structure configured to support an imprint template, the support structure comprising an actuator arranged to apply a force to a side of the imprint template at a position substantially on the neutral plane of the imprint template.

DETAILED DESCRIPTION

Magnification correction is a technique in which force is applied to an imprint template in order to deform and compress the template, and hence the pattern carried on the template, to counteract the effect of a change in the size of the template, such as that may occur as a result of thermal expansion. Shape correction involves the application of force to a template to counteract a change in the shape of the template and the pattern carried thereon. Magnification correction and/or shape correction may be used in order to ensure correct registration of sequential lithographic imprints superimposed on the same substrate to meet overlay requirements. An apparatus or method as disclosed herein may be used in a magnification correction technique and/or a shape correction technique.

Magnification or shape correction techniques may be used to deform a template, as described above, in order to counteract the effect of a change in the size or shape of the substrate on which imprinting is to occur. Such a change of a substrate may be caused by expansion, or other stress, of the substrate, or to a difference in size or shape of one or more elements formed in a preceding lithography step (e.g. a preceding optical or imprint lithography step).

Figure 2A:
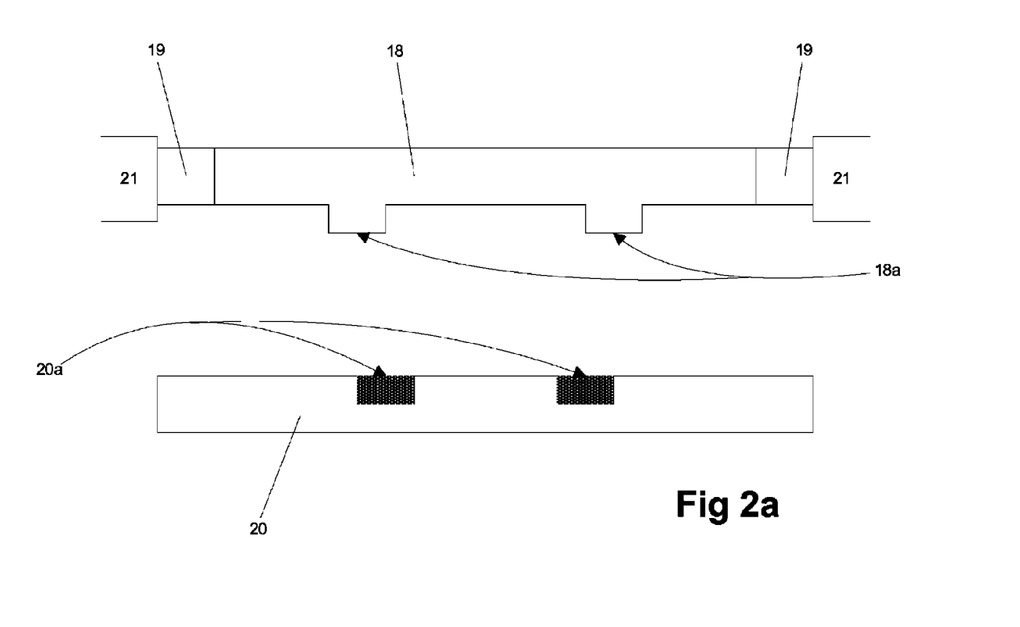
FIGS. 2a and 2b schematically show an imprint lithography process utilizing a magnification correction technique.
Figure 2B:
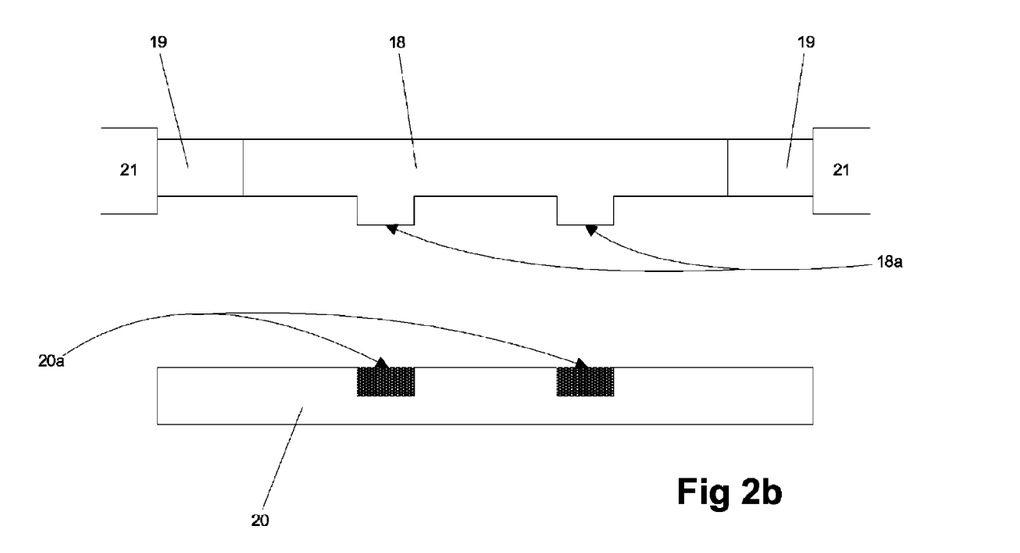

FIG. 2 shows an imprint lithographic technique utilizing magnification correction to achieve demagnification.

In this technique an imprint template 18 is supported in a support structure 21, and one or more actuators 19 are located between the support structure 21 and the peripheral side(s) of the imprint template. In FIG. 2a, the imprint template 18 is shown with two features 18a that are to be imprinted onto corresponding features 20a on a previously imprinted substrate 20. Thermal expansion of the template 18 is such that, in its normal resting state, features 18a on the template are not aligned with features 20a on the substrate.

In order to achieve correction of the magnification that has taken place as a result of thermal expansion, the actuator(s) 19 is used to deform the template 18 to counteract the effect of thermal expansion. The extent of expansion is assessed, and from this the amount of force to be applied to the imprint template 18 in order to offset the expansion is calculated. As shown in FIG. 2b, urging of the actuator(s) 19 against support structure 21 and the peripheral side(s) of the imprint template 18 applies force to the template, and causes the imprint template to deform inwardly towards the center of the template. This deformation is sufficient to compress the template 18, and thereby allow alignment of features 18a on the imprint template with features 20a on the substrate 20. Once alignment has been achieved imprinting may then take place.

In addition or alternatively to counteracting an increase in the size of an imprint template resulting from, e.g., thermal expansion of the template, a similar correction technique may be used to correct an irregularity in the shape of the template or substrate, or the pattern on the template or substrate, that may arise, for example, during manufacture or as a result of subsequent wear. In this case, the force required to offset the irregularity in the shape of the template or substrate is calculated, and the applicable force is applied to the template by the actuator(s) 19.

The use of a curved flexible imprint template has been suggested as an improvement of existing imprint lithographic techniques. In the above-mentioned approaches to imprint lithography, especially hot imprint lithography and UV imprint lithography, an imprint liquid is sandwiched between a substrate and a template to form a thin continuous layer over the entire area of the template. When the imprint liquid is sandwiched between the substrate and the template, the liquid is expelled outwardly, so that it ultimately forms a thin continuous layer of liquid. At the same time, gas (e.g., air) present between the template and the substrate is also sandwiched. As the distance between template and substrate reduces it is more difficult for the imprint liquid and gas to flow outwardly and around features of the template. The closer the template is to the substrate, the more slowly the imprint liquid flows. Thus, since the imprint liquid flows slowly, the time taken to form a thin continuous layer increases. Similarly, the closer the template is to the substrate, the longer it takes to expel gas from between the imprint template and the substrate. It is also possible that gas sandwiched between the template and the substrate may become trapped, forming gas bubbles that may introduce defects into the imprint pattern.

To try to address such a problem (or one or more other problems), it has been suggested to utilize an imprint lithography apparatus and method in which force is applied to an imprint template or imprint template holder such that the imprint template or imprint template holder bends and forms an outwardly curved surface. This outwardly curved surface is then used to impart a pattern onto imprint liquid on a substrate.

FIG. 3a shows the use of an imprint template 22 that has been bent by the application of force to its peripheral edge(s) by one or more actuators 23. The template is bent such that an outwardly curved surface 22a is formed, and this curved surface is used to imprint a pattern onto imprint liquid 24 deposited on the substrate 21. FIG. 3b illustrates the bent imprint template 22 coming into contact with the imprint liquid 24.

Because the outwardly curved surface 22a of the imprint template 22 is used to impart a pattern in the imprint liquid 24 on the substrate 21, the gap between the imprint template 22 and the substrate 21 increases from the center to the edge(s) of the imprint template 22. As a result the imprint liquid 24 and gas 26 may flow more readily away from the center of the imprint template 22. As a result of the improved flow of imprint liquid 24 and gas 26 there is less resistance encountered by the imprint template 22 when it is brought into contact with the imprint liquid. This reduced resistance allows the imprint process to be undertaken more rapidly. Furthermore, the incidence of gas pockets forming in the imprint pattern are reduced since the gas 26 is pushed away from the center of the imprint template 22 due to the curvature of the imprint template 22.

Once the bent imprint template 22 has been brought into contact with the imprint liquid 24, the force applied by the actuator(s) 23 may be reduced, and the imprint template 22 thus flattened onto the imprint liquid 24 to imprint a pattern into the imprint liquid 24.

Figure 4A:
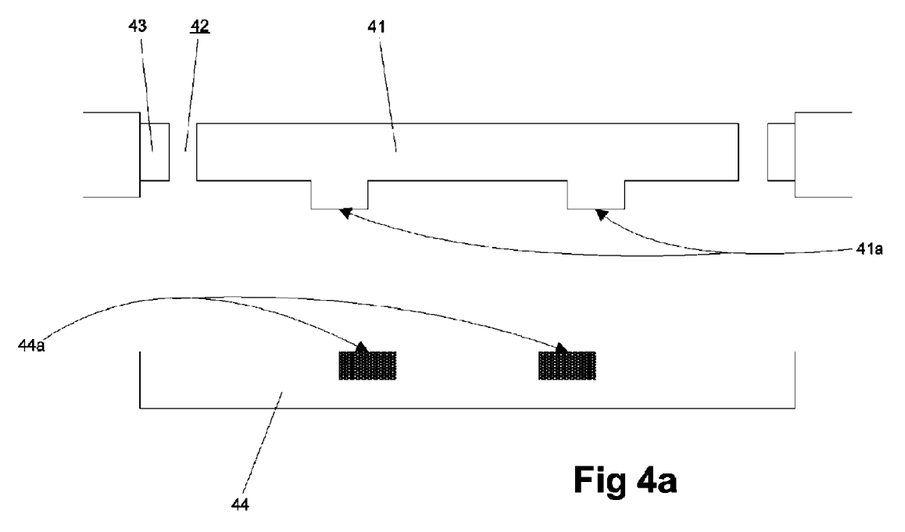
FIGS. 4a and 4b schematically show an imprint apparatus according to an embodiment of the present invention FIGS. 5a and 5b schematically show an imprint apparatus according to an embodiment of the present invention.
Figure 4B:
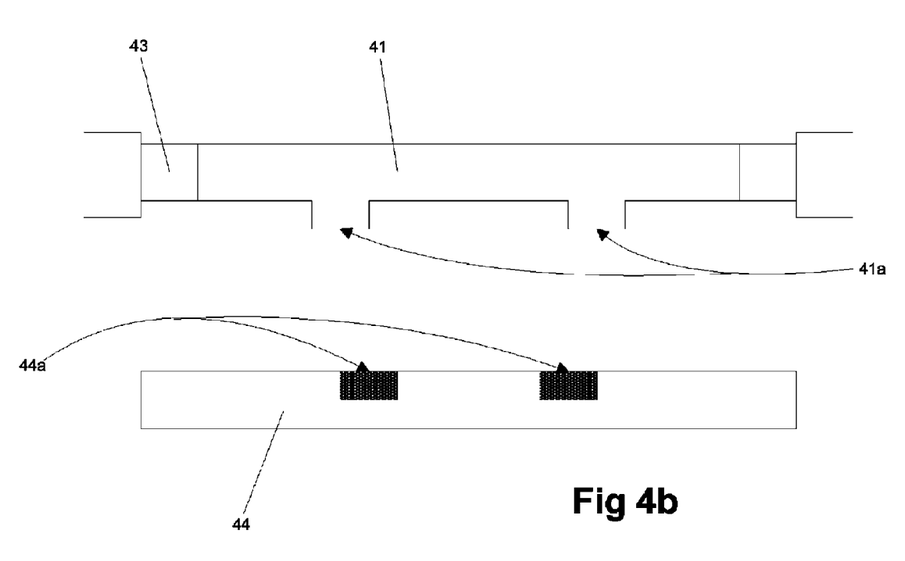

FIG. 4 shows a possible failing in a magnification correction technique. In FIG. 4, thermal expansion of an imprint template 41 has occurred, and the force to offset this expansion has been calculated, as described above. However, in this case a gap 42 (shown exaggerated for the purposes of the present drawing) is located between actuator(s) 43 and the peripheral edge(s) of the template 41. As a result, not all of the force generated on expansion of the actuator(s) 43 is applied to the imprint template 41, and instead, some expansion of the actuator(s) is lost in expansion through the gap 42 before contact with the template's peripheral edge(s). The force applied to the template 41 is thus lessened, and the extent to which the template is deformed is reduced so that features 41a on the template do not align with features 44a on the substrate 44. It can be seen that the force applied to the template in this case is improperly regulated.

It will be appreciated that a similar difficulty in regulation of the force applied to a template may arise in the event that a support structure supporting the template and actuator(s) deforms under the urging of the actuator(s). In that case as well or alternatively, a portion of the force that would otherwise be applied by the actuator(s) to the imprint template is lost, and deformation of the imprint template is less than would be expected. As a result desired deformation of the imprint template may not be achieved, and proper magnification correction may not occur.

Figure 5A:
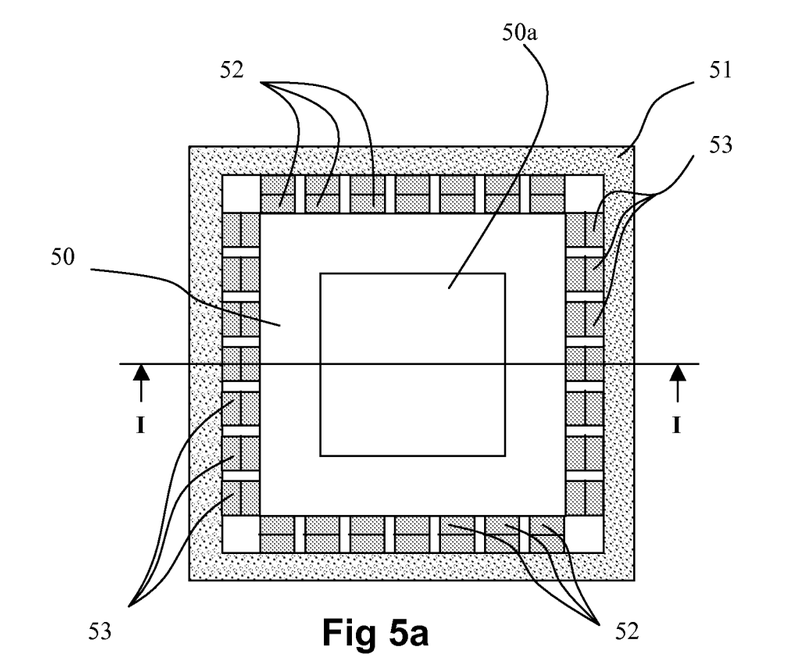
Figure 5B:
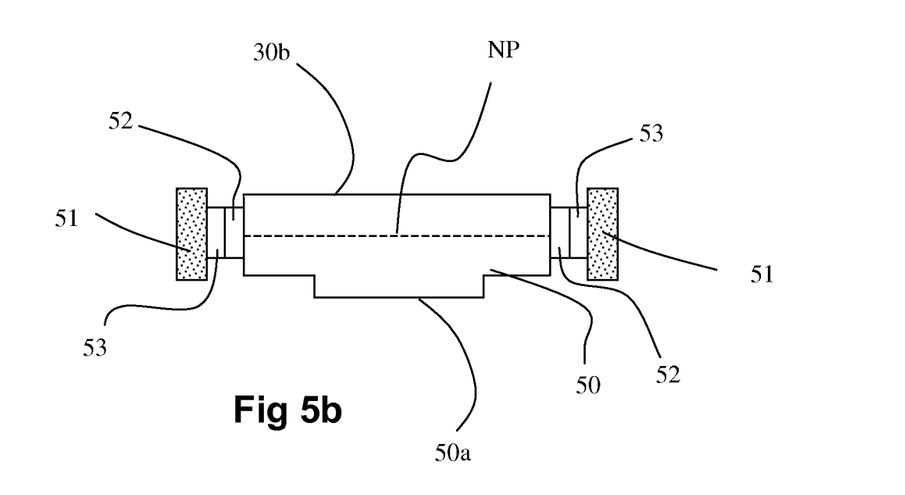

FIGS. 5a and 5b illustrate an imprint apparatus according to an embodiment of the present invention. FIG. 5a shows an underside view of the apparatus, and FIG. 5b illustrates a part section view of the apparatus of FIG. 5a taken along the line I-I.

The apparatus is shown as including an imprint template 50, which is substantially planar in shape. The imprint template 50 has two substantially square surfaces, one of which is provided with a patterned region 50a. The imprint template 50 has four peripheral sides which extend around the imprint template 50. Extending around the periphery of the imprint template 50 is a support structure 51. The support structure 51 is connected to the imprint template 50 through piezoelectric actuators 52 and piezoelectric force sensors 53. The piezoelectric actuators 52 and piezoelectric force sensors 53 are connected in series, so that the piezoelectric actuators 52 abut the peripheral faces of the imprint template 50 and the piezoelectric force sensors 53, and the piezoelectric force sensors 53 abut the piezoelectric actuators 52 and an interior face of the support structure 51. In the embodiment shown the piezoelectric actuators 52 and piezoelectric force sensors 53 project from the support structure 51, but in an embodiment the actuators 52 and sensors 53 may be accommodated in recesses in the imprint template 50 or support structure 51. When loaded in pure bending, the neutral plane NP of the imprint template 50 is a plane where compression and tension stresses are zero. The neutral plane NP extends through and across the imprint template and substantially bisects each of the imprint template's 50 peripheral faces. As can be seen from FIG. 5b, the piezoelectric actuators 52 meet the imprint template 50 at a location substantially on the template's neutral plane NP, and are thereby able to apply a force to the template that is substantially on the neutral plane, and thus substantially even about the neutral plane. While multiple actuators and force sensors are depicted, a single actuator and force sensor, a single actuator and a plurality of force sensors, or a plurality of actuators and a single force sensor may be provided.

Figure 6A:
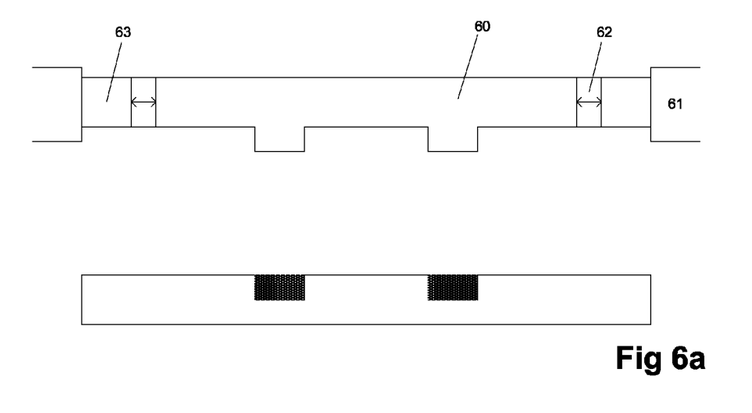
FIGS. 6a and 6b schematically show an imprint apparatus according to an embodiment of the present invention.

FIG. 6 shows in schematic form a possible mode of operation of the imprint lithographic apparatus according to an embodiment of the invention. In FIG. 6a, a voltage is established across the piezoelectric actuators 62 prior to imprinting, causing the actuators to expand. The piezoelectric actuators 62 are thus urged against the peripheral edges of the imprint template 60, and against the piezoelectric force sensors 63, compressing both the template 60 and the sensor 63. This compression of the piezoelectric force sensor 63 causes an electrical signal to be generated, this signal being indicative of the magnitude of the force applied to the sensor 63. The force being applied to the imprint template 60 is then compared with the amount of force that has been calculated as necessary to provide appropriate magnification correction. In the event that the force applied is sufficient to provide the necessary correction then the corresponding voltage is used for imprinting.

Figure 6B:
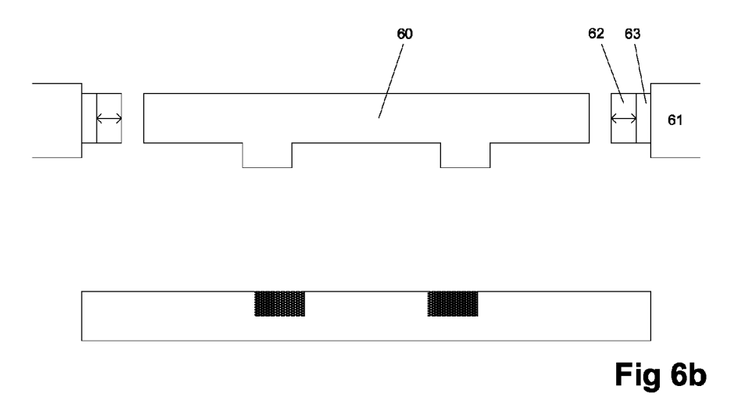
Figure 6C:
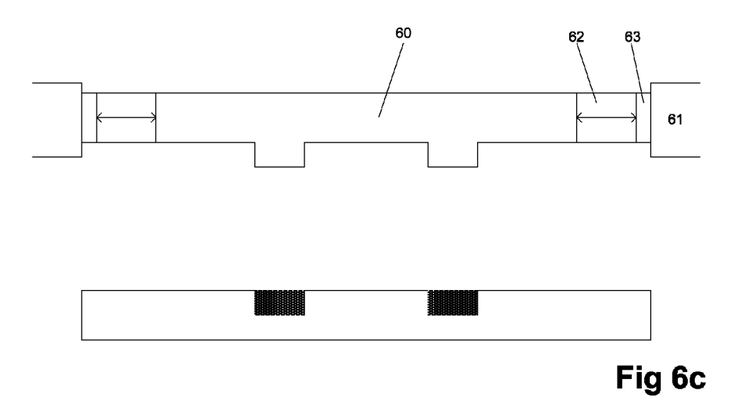

FIGS. 6b and 6c illustrate operation of an imprint lithographic apparatus of an embodiment of the invention when a gap 64 has arisen between one or more of the actuators 62 and the imprint template 60. It will be recognized that the presence of a gap anywhere in the path along which a piezoelectric actuator 62 may apply force to a peripheral edge of the imprint template 60 (for example, a gap between the piezoelectric actuators 62 and the peripheral edges as shown in FIG. 6b) will reduce the amount of force applied to the piezoelectric force sensor 63 on expansion of the piezoelectric actuator 62, and thus reduce the signal produced by the sensor 63. This signal indicative of the reduced force applied to the piezoelectric force sensor is compared with the amount of force that has been calculated to provide magnification correction. In the event that insufficient force is detected by the piezoelectric force sensor 63 imprinting will not occur.

As shown in FIG. 6c, appropriate compensation for this reduction in force may then be achieved by increasing the voltage applied to the piezoelectric actuators 62, thus increasing their expansion to compensate for the presence of the gap 64. The signal produced by the piezoelectric force sensors 63 in response to this increased expansion of the piezoelectric actuators 62 may then be assessed once again. If the force applied to the piezoelectric force sensors 63 remains too low, and thus the force applied to the imprint template 60 will still be too low to provide magnification correction, a still larger voltage may be applied across the piezoelectric actuators 62 and the force generated assessed again. The process of increasing the voltage applied across the piezoelectric actuators 62 and assessing the signal produced by the piezoelectric force sensors 63 may then be repeated as often as necessary until the signal representative of the force applied to the piezoelectric force sensors 63, and thus to the imprint template 60, indicates that this force is sufficient to provide effective magnification correction. Once the voltage causing this required force is established, this voltage may be applied to the piezoelectric actuators 62, the imprint template 60 deformed sufficient to correct for magnification, and imprinting can then take place.

Figure 7A:
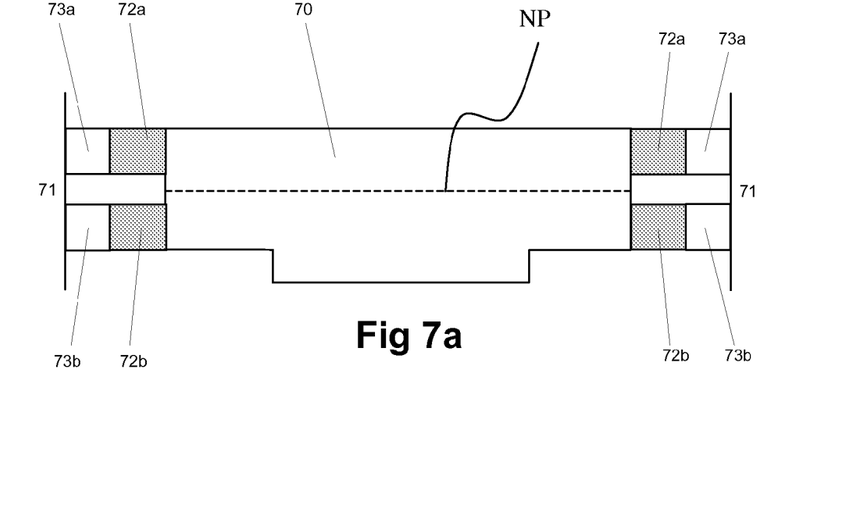
FIGS. 7a-7c schematically show use of the apparatus of FIGS. 6a and 6b in an imprint lithography process utilizing a curved imprint template.
Figure 7B:
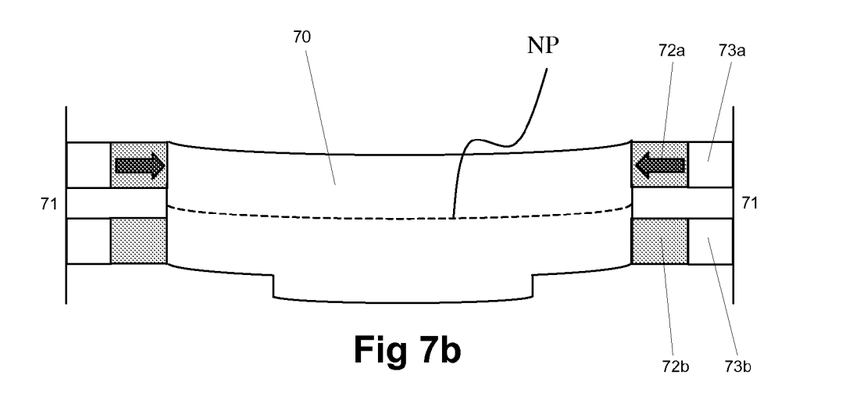

In the case that the imprint lithography apparatus of an embodiment of the invention is to be used in magnification correction or shape correction, the force applied to the imprint template should be applied substantially on the neutral plane of the template. This may be achieved by the provision of actuators 52 meeting the imprint template 50 substantially at the neutral plane, as shown in FIG. 5b. Alternatively or additionally, provision of force substantially in the neutral plane may be achieved by providing one or more actuators that meet the imprint template on both sides of the neutral plane. An arrangement of an imprint lithography apparatus in accordance with this embodiment of the invention is shown in FIG. 7a. In FIG. 7a, it can be seen that there are two layers of piezoelectric actuators 72 and force sensors 73 attaching the imprint template 70 to the support structure 71. A first layer of piezoelectric actuators 72a and piezoelectric sensors 73a are located above the neutral plane NP of the imprint template 70. A second layer of piezoelectric actuators 72b and piezoelectric force sensors 73b are located below the neutral plane NP of the imprint template 70. The first and second layers of piezoelectric actuators 72 and force sensors 73 extend substantially parallel to one another, and along the or each respective side of the support structure 71. In FIG. 7b the piezoelectric actuators 72a and 72b are shown to provide a force to the imprint template 70 that is substantially equal across both sides of the template's neutral plane NP. Once the piezoelectric force sensors 73a and 73b determine that the force applied to the imprint template 70 by the piezoelectric actuators 72a and 72b is sufficient to bring about magnification correction, imprinting may occur. While multiple actuators and force sensors are depicted, a single actuator and force sensor, a single actuator and a plurality of force sensors, or a plurality of actuators and a single force sensor may be provided.

Figure 7C:
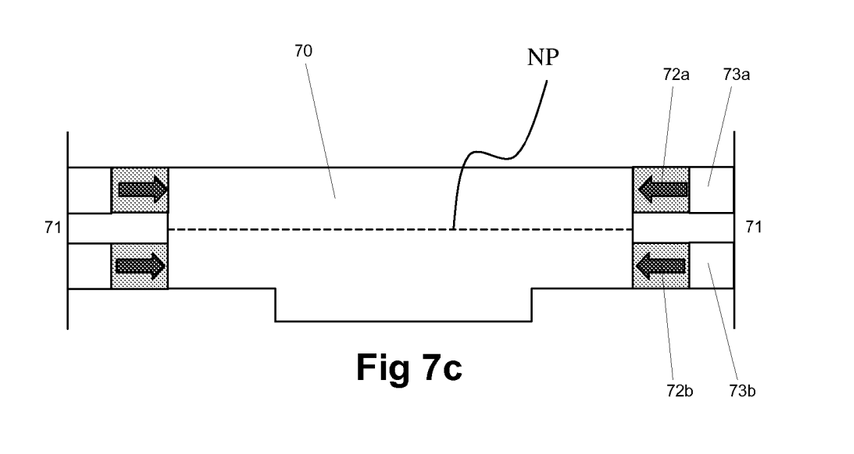

The use of actuators that meet the imprint template at a position displaced from the neutral plane allows an imprint lithography apparatus in accordance with an embodiment of the present invention to be used in imprint lithography using a bent template, as described above in relation to FIG. 3. Such an arrangement is shown in FIG. 7c. If a force directed towards the center of the imprint template 70 is applied to the peripheral face(s) of the imprint template 70 unevenly above or below the neutral plane, the imprint template 70 can be made to bend up or down (in relation to the orientation of the imprint template 30 shown in FIG. 7c) depending on whether the greater force is applied above or below the neutral plane NP. It will be appreciated that this effect may be achieved by the application of a force on only one side (i.e. above or below) the neutral plane NP. Alternatively this may be achieved by application of force on both sides of the neutral plane NP, as long as a relatively greater force is provided one side of the neutral plane than the other.

It will be appreciated that an imprint lithography apparatus of an embodiment of the invention incorporating layers of piezoelectric actuators and piezoelectric force sensors may be used to regulate the force applied to an imprint template, and thus control the degree of curvature attained.

As shown in FIG. 7a, when no voltage is applied to the piezoelectric actuators 72a, 72b, these do not expand and thus do not apply any force to the imprint template 70, or to the piezoelectric force sensors 73a, 73b positioned between the actuators and the support structure 71.

When a voltage is applied across the first layer of piezoelectric actuators 72a these actuators undergo a converse piezoelectric effect, and deform such that they apply a force towards the center of the template 70 and through the piezoelectric sensors 73a towards the support structure 71. Since the force applied to the template 70 is applied above the neutral plane NP it causes the imprint template 70 to bend downwards. The force applied by the piezoelectric actuators 72a through the piezoelectric force sensors 73a causes these sensors to undergo a direct piezoelectric effect, in which force applied to the sensors 73a causes the generation of an electrical potential. The magnitude of this potential is indicative of the force applied to the piezoelectric force sensors 73a, and so may be used to assess the effective force applied by the piezoelectric actuators 72a to the template 70. This force may then be compared with a force known to be required to impart a desired level of curvature to the imprint template 70. In the event that the force applied to the imprint template 70 is less than the required force, then the voltage applied across the piezoelectric actuators 72 applying the force may be increased. In the event that the force applied to the imprint template 70 is greater than the force required to impart the desired curvature, then the voltage applied across the piezoelectric actuators 72 may be decreased.

When the imprint template 70 and patterned region 70a have been made to bend downwards, the imprint template 70 can be used in the same way as described in relation to the bent template 22 of FIGS. 2a and 2b. Once the bent imprint template 70 comes into contact with imprint liquid deposited on a substrate, the difference between the forces applied above and below the neutral plane are reduced, causing the imprint template 70 to flatten. This reduction in the differential between the two forces may be achieved by reducing the previously greater force (so that it more closely approximates the previously lower force) and/or by increasing the previously lower force (so that it more closely approximates the previously higher force). By way of example, in the case that it is wished to reduce the previously greater force, the voltage applied across the upper layer of piezoelectric actuators 72a may be reduced. In the case that it is wished to increase the previously lesser force, the voltage applied across the lower layer of piezoelectric actuators 72b may be increased. In the event that it is wished to undertake a magnification or shape correction associated with the imprinting, a suitable voltage may be applied substantially equally across both layers of piezoelectric actuators 72a and 72b, resulting in both flattening of the imprint template and its deformation suitable to put into effect a correction process.

Figure 8:
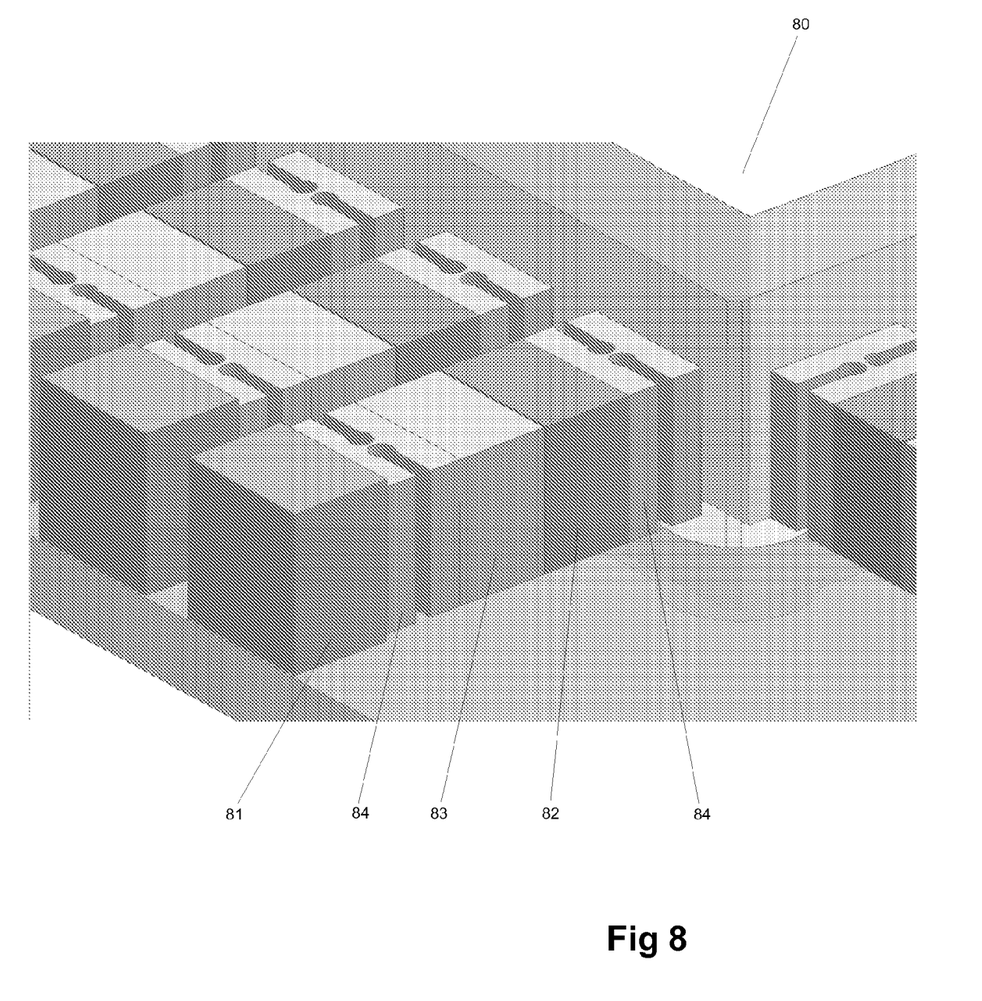
FIG. 8 shows a detail of an imprint apparatus according to an embodiment of the invention.

FIG. 8 shows a detail of an imprint lithography apparatus in accordance with an embodiment of the present invention. An imprint template 80 is connected to a support structure 81 by means of piezoelectric actuators 82 and piezoelectric force sensors 83. The piezoelectric actuators 82 and piezoelectric force sensors 83 are arranged in series, and elastic hinges 84 are provided on each side of the paired actuators and force sensors. These elastic hinges 84 help to protect the piezoelectric actuators 82 and piezoelectric force sensors 83 against bending moments that may otherwise damage the piezoelectric elements.

An imprint lithography apparatus in accordance with an embodiment of the invention may be provided with a plurality of actuators and/or with a plurality of force sensors. The most suitable number of actuators and/or force sensors may be determined with reference to the size of the imprint template, and with reference to the effect that is to be achieved (e.g. magnification correction, and/or shape correction, and/or use of the imprint template as a curved template). The number, type and arrangement of actuators and/or sensors may vary depending on the structure of the imprint template itself. For example, for an imprint template having an area of 30 mm$^2$ with a 25 mm$^2$ patterned region, when actuators and force sensors are paired in series, a particularly suitable arrangement is to provide seven such pairs per side of the imprint template. However, any suitable number of actuators and/or force sensors may be used.

For the purposes of the present disclosure the imprint template should be taken to comprise any structure used to transfer a pattern onto a substrate, and that is able to be deformed under the urging of an actuator, for example to allow a magnification correction or size correction technique to be practiced. It will be appreciated that the template will comprise both those features that contact that substrate, and any structure on which such features are carried (which may be manufactured as a whole with these features, or, for example, as a separate holder). Suitable deformation may be achieved by the application of force to the features directly, or to any structure on which these features are carried.

An imprint lithography apparatus according to an embodiment of the invention has been described with reference to the use of piezoelectric actuators and piezoelectric force sensors. For the purposes of the present disclosure, references to piezoelectric force sensors should be taken to encompass piezoresistive force sensors (in which the application of pressure induces a change in the electrical resistance of material of the force sensor). Indeed, piezoresistive force sensors represent a desired force sensor for use in an apparatus or method of an embodiment of the invention.

It will be appreciated that one or both of the actuators or force sensors may be replaced with an alternative actuator and/or force sensor such as a hydraulic miniature piston, or a compact linear electrical motor and lever (the lever being used to magnify the force generated by the linear motor to generate force of sufficient magnitude to deform the imprint template). Any suitable actuator configured to impart a force on the imprint template may be used, as may any suitable force sensor configured to sense a force applied to the template.

In certain circumstances (e.g. where reduced temperature has caused contraction of an imprint template, or in a certain shape correction application), it may be desirable to utilize actuators configured to induce the template to expand by placing the template under tension (i.e. by pulling on the template). In such a case, a suitable force sensor would one configured to sense the force applied in causing such expansion.

The embodiments thus far have been shown with an actuator and force sensor arranged in series, however an embodiment may, alternatively or additionally, make use of an actuator and force sensor arranged in parallel.

In an apparatus in which the actuators and force sensors are arranged in series, the order of these components may be substituted without detracting from one or more of the advantages described herein. An embodiment has been described with reference to an apparatus in which the actuators abut the imprint template, and in which the force sensors abut the support structure. In embodiment, this order of actuator and force sensor may be reversed. Indeed, in any embodiment described herein, neither the actuator nor the force sensor need directly abut the imprint template, as long as they are configured such that the actuator is able to apply a force to the imprint template, and the force sensor is able to sense the force applied to the template to allow an assessment of this force to be made. In light of the above, it will be appreciated that a suitable force sensor may be any sensor able to provide an indication of the force applied to the template.

The preceding descriptions have related to embodiments in which the force applied to the imprint template is assessed by means of sensors that are compressed on application of such a force. However, the force applied to the imprint template may be assessed by extension of force sensors located between the support structure and the imprint template. This arrangement may be of use in an apparatus in which the force actuators and sensors are arranged in parallel. In this case, compression of the imprint template by the actuators will result in an extension of force sensors positioned in parallel with the actuators, and this extension may be used to determine the amount of compression occurring through the action of the actuators. In this case the force sensor may comprise an elongation sensor which may be used to report on the amount of force applied to the imprint template. This may, for example, be achieved by use of a reference value, in which a given extension of the sensor is known to correlate with a given amount of force applied to the imprint template. In the event that the force actuators and force sensors are arranged in parallel, it may be desirable that the force sensor be used to sense force applied to the imprint template by an actuator adjacent the force sensor.

The embodiments of the invention described thus far have been provided with both actuators and force sensors on all sides of the imprint template. An embodiment may provide actuators and/or force sensors on three sides of a four-sided imprint template, on two sides of an imprint template (e.g., on non-opposing sides), or even on one side of an imprint template. In an apparatus in which the actuators and force sensors are arranged in series, these components may be provided on different sides of the imprint template (e.g. an arrangement with actuators only on one side of the imprint template, and force sensors only on an opposing side of the imprint template), as long as the force sensors are arranged such that they can assess the force applied to the imprint template.

When a voltage is applied across a piezoelectric actuator, the force imparted to the force sensor, and hence to the template, is compared to that which has been calculated to be desired (e.g. for magnification or shape correction, or to cause curvature of the template), and imprinting occurs once the voltage producing the requisite force has been established. If the force is too low, the voltage applied to the piezoelectric actuator is increased, and the force applied assessed and compared once more. If the force is too great, the voltage applied to the piezoelectric actuator is decreased, and the force applied assessed and compared once more. It will be appreciated that the increase or decrease of the voltage may take place in a "step" fashion (i.e. through a series of discrete increases or decreases, which may be separated by periods at which substantially no voltage is applied across the piezoelectric actuators, each followed by an assessment of force), or may take place in a "ramped" fashion, in which the voltage is changed relatively steadily until the requisite force is achieved (with assessment of the force conducted either continuously or at suitable intervals). It may be desirable that a voltage be maintained across an actuator at the same time that the force imparted as a result of the voltage is assessed.

The force that may be applied to an imprint template in order to cause suitable magnification or shape correction, or to impart a desired degree of curvature, may be readily determined by those skilled in the art. By way of example, a suitable method by which such a determination may be made includes the use of a linear elasticity model. In the case of a magnification correction, it may be desirable to calculate the desired force analytically. When the template may require a complex shape correction, it may be desirable to use a finite element method or finite volume method. A suitable method may use a simplified model in which some desired values are interpolated between calculated values.

It will be appreciated that, in the case of actuators and force sensors utilizing electrical power or signals, suitable electrical connections should be provided as part of the apparatus. Suitable connections may be shielded connections.

The preceding description has considered an imprint template and substrate that are of substantially square shape. An apparatus and method of an embodiment of the invention may, alternatively or additionally, be used with a substrate and/or template having a different shape. Merely by way of example, this may include a rectangular template or substrate, or trapezoidal substrate or template. The in-plane shape or magnification correction techniques that may be put into practice using an apparatus or method of an embodiment of the invention are also able to counteract unidirectional elongation and pin-cushion effects.

For illustrative purposes, the gaps referred to in the preceding paragraphs (and shown in the accompanying drawings) have been shown as voids in which no material is present. However, it would be appreciated that gaps may be filled with relatively soft material, such as glue or the like. Indeed, for the purposes of present disclosure, a gap should be taken as comprising any region where there is an absence of a material having sufficient stiffness to allow the urging of an actuator acting against the material to be transferred to an imprint template. Thus a gap may comprise a void, or may comprise an area of relatively soft material (effectively a gap for the present purposes).

The descriptions above are intended to be illustrative, not limiting. Thus, it will be apparent to one skilled in the art that modifications may be made to the present invention as described without departing from the scope of the claims set out below.

What is claimed is:

1. An imprint lithography apparatus comprising:
   a support structure configured to hold an imprint template;
   an actuator located between the support structure and a side of the imprint template, when the imprint template is held by the support structure, configured to apply a compressive force to the imprint template but not at a point of contact on the neutral plane; and
   a force sensor between the support structure and a side of the imprint template and in direct contact with the support structure, when the imprint template is held by the support structure, wherein the sensor is in parallel with the actuator.

2. The imprint lithography apparatus of claim 1, wherein the force sensor is configured to measure a pressure applied to the imprint template.

3. The imprint lithography apparatus of claim 1, wherein the force sensor comprises a plurality of force sensors.

4. The imprint lithography apparatus of claim 1, wherein the force sensor comprises a piezoelectric sensor.

5. The imprint lithography apparatus of claim 4, wherein the piezoelectric sensor comprises a piezoresistive force sensor.

6. The imprint lithography apparatus of claim 1, further comprising a hinge, the hinge in series with the actuator.

7. The imprint lithography apparatus of claim 6, wherein the hinge comprises an elastic hinge.

8. The imprint lithography apparatus of claim 1, further comprising an actuator configured to meet the imprint template at a location substantially on the neutral plane of the imprint template.

9. The imprint lithography apparatus of claim 1, wherein the actuator comprises a plurality of actuators.

10. The imprint lithography apparatus of claim 9, wherein at least one of the actuators has a point of contact only above the neutral plane of the imprint template and at least another one of the actuators has a point of contact only below the neutral plane of the imprint template.

11. The imprint lithography apparatus of claim 1, wherein the actuator comprises a piezoelectric actuator.

12. The imprint lithography apparatus of claim 1, comprising an actuator selected from the group consisting of a hydraulic piston and an electric motor.

13. An imprint lithography apparatus, comprising:
   a support structure configured to support an imprint template;
   an actuator, located between the support structure and a side of the imprint template when the imprint template is supported by the support structure, configured to apply a compressive force to the imprint template;

a force sensor, located between the support structure and the actuator, configured to generate a signal representing a measured force; and a force sensor controller configured to, based on the signal representing the measured force, compare the measured force to the compressive force expected to be applied by the actuator to the imprint template, and generate a signal indicative of a gap between the actuator and the side of the imprint template responsive to the comparison determining that the measured force is less than the expected compressive force.

14. The imprint lithography apparatus of claim 13, wherein the force sensor comprises a piezoelectric sensor.

15. The imprint lithography apparatus of claim 14, wherein the piezoelectric sensor comprises a piezoresistive force sensor.

16. The imprint lithography apparatus of claim 13, further comprising a hinge, the hinge in series with the actuator.

17. The imprint lithography apparatus of claim 16, wherein the hinge comprises an elastic hinge.

18. An imprint lithography apparatus, comprising:

a support structure configured to support an imprint template;

an actuator located between the support structure and a side of the imprint template when the imprint template is supported by the support structure, configured to apply a compressive force to the imprint template;

a force sensor, located between the support structure and the actuator, configured to generate a signal representing a measured force; and a force sensor controller configured to, based on the signal representing the measured force, compare the measured force to the compressive force expected to be applied by the actuator to the imprint template, and generate a signal indicative of a gap between the actuator and the side of the imprint template responsive to the comparison determining that the measured force is less than the expected compressive force, wherein the actuator is arranged to apply a compressive force to a side of the imprint template at a position substantially on the neutral plane of the imprint template.

19. The imprint lithography apparatus of claim 18, wherein the force sensor comprises a piezoelectric sensor.

20. The imprint lithography apparatus of claim 19, wherein the piezoelectric sensor comprises a piezoresistive force sensor.

21. The imprint lithography apparatus of claim 18, further comprising a hinge, the hinge in series with the actuator.

22. The imprint lithography apparatus of claim 21, wherein the hinge comprises an elastic hinge.

23. An imprint lithography apparatus, comprising:

a support structure configured to support an imprint template, the support structure comprising an actuator arranged to apply a compressive force to a side of the imprint template but not at a point of contact on the neutral plane; and a force sensor between the support structure and a side of the imprint template and in direct contact with the support structure, wherein the sensor is in parallel with the actuator.

24. The imprint lithography apparatus of claim 23, wherein the force sensor comprises a piezoelectric sensor.

25. The imprint lithography apparatus of claim 24, wherein the piezoelectric sensor comprises a piezoresistive force sensor.

26. The imprint lithography apparatus of claim 23, further comprising a hinge, the hinge in series with the actuator.

27. The imprint lithography apparatus of claim 26, wherein the hinge comprises an elastic hinge.

28. The imprint lithography apparatus of claim 23, wherein the force sensor is configured to measure a pressure applied to the imprint template.

29. The imprint lithography apparatus of claim 23, wherein the actuator comprises a plurality of actuators and at least one of the actuators has a point of contact only above the neutral plane of the imprint template and at least another one of the actuators has a point of contact only below the neutral plane of the imprint template.

* * * * *